(12) United States Patent
Hallock et al.

(10) Patent No.: US 8,653,673 B2
(45) Date of Patent: Feb. 18, 2014

(54) METHOD FOR PACKAGING SEMICONDUCTORS AT A WAFER LEVEL

(75) Inventors: Robert B. Hallock, Newton, NH (US); William J. Davis, Hollis, NH (US); Yiwen Zhang, Bedford, MA (US); Ward G. Fillmore, Hudson, MA (US); Susan C. Trulli, Lexington, MA (US); Jason G. Milne, Hawthorne, CA (US)

(73) Assignee: Raytheon Company, Waltham, MA (US)

( * ) Notice: Subject to any disclaimer, the term of this patent is extended or adjusted under 35 U.S.C. 154(b) by 104 days.

(21) Appl. No.: 13/331,408

(22) Filed: Dec. 20, 2011

(65) Prior Publication Data

US 2013/0154124 A1    Jun. 20, 2013

(51) Int. Cl.
    *H01L 23/48* (2006.01)
(52) U.S. Cl.
    USPC .... 257/782; 257/780; 257/796; 257/E21.502; 257/E23.01; 438/106; 438/107; 438/127
(58) Field of Classification Search
    USPC ................................. 257/678–733, 780–796, 257/E23.001–E23.194
    See application file for complete search history.

(56) References Cited

U.S. PATENT DOCUMENTS

| | | |
|---|---|---|
| 2002/0079590 A1 | 6/2002 | Nakaoka et al. |
| 2005/0104204 A1 | 5/2005 | Kawakubo et al. |
| 2006/0211233 A1 | 9/2006 | Gan et al. |
| 2008/0064142 A1 | 3/2008 | Gan et al. |
| 2008/0197514 A1 | 8/2008 | Goida |
| 2008/0308922 A1 | 12/2008 | Zhang et al. |
| 2010/0013088 A1* | 1/2010 | Davis et al. .................. 257/701 |
| 2010/0181681 A1 | 7/2010 | Akiba et al. |
| 2012/0067871 A1* | 3/2012 | Sherrer et al. ............... 219/678 |

FOREIGN PATENT DOCUMENTS

| | | |
|---|---|---|
| DE | 10 2005 023 949 A1 | 11/2006 |
| FR | 2 797 977 A1 | 3/2001 |

OTHER PUBLICATIONS

Notification of Transmittal of The International Search Report and The Written Opinion of the International Searching Authority, or the Declaration, PCT/US2012/066053, Mar. 6, 2013, 1 page.
International Search Report, PCT/US2012/066053, Mar. 6, 2013, 4 pages.
Written Opinion of the International Searching Authority, PCT/US2012/066053, Mar. 6, 2013, 7 pages.
U.S. Appl. No. 13/200,477, filed Sep. 23, 2011, entitled Aerogel Dielectric Layer, pp. 1-21.

* cited by examiner

*Primary Examiner* — Mamadou Diallo
(74) *Attorney, Agent, or Firm* — Daly, Crowley, Mofford & Durkee, LLP

(57) ABSTRACT

A package and method for packaging a semiconductor device formed in a surface portion of a semiconductor wafer. The package includes: a dielectric layer disposed on the surface portion of the semiconductor wafer having a device exposing opening to expose one of the devices and an electrical contacts pad opening to expose an electrical contact pad; and a porous material in the device exposing opening over said one of the devices.

20 Claims, 4 Drawing Sheets

METHOD FOR PACKAGING SEMICONDUCTORS AT A WAFER LEVEL

TECHNICAL FIELD

This invention relates generally to methods for packaging (i.e., encapsulating) semiconductors and more particularly to methods for packaging semiconductors at a wafer level (i.e., wafer-level packaging).

BACKGROUND AND SUMMARY

As is known in the art, traditionally in the microelectronics industry, electrical devices are fabricated on wafers and then diced into individual chips. The bare chips would then get assembled with other components into a package for environmental and mechanical protection. In commercial applications, the chips were generally assembled into plastic packages. In military applications, where electronics are generally exposed to harsher environments, the parts are generally housed in a hermetic module. Such packages or modules would then be further assembled unto circuit boards and systems. However, as electronic systems advance, there is a need to increase functionality while decreasing the size and cost of components and sub-systems.

One way to reduce size and cost is to create packages at the wafer level and then subsequently dicing the wafer into individual packaged semiconductors (i.e., wafer-level packaging). Many methods have been suggested to create wafer-level packages. One method, call wafer bonding, is to bond a wafer with pre-formed cavities over the device wafer. The bonding can be achieved through thermal bonding, adhesive or solder bonding, see for example, Rainer Pelzer, Herwig Kirchberger, Paul Kettner, "Wafer-to Wafer Bonding Techniques: From MEMS Packaging to IC Integration Applications", $6^{th}$ IEEE International Conference on Electronic Packaging Technology 2005 and A. Jourdain, P. De Moor, S. Pamidighantam, H. A. C. Tilmans, "Investigation of the Hermeticity of BCB-Sealed Cavities For Housing RF-MEMS Devices", IEEE Electronic Article, 2002.

However, this method introduces a lot of complexity into the process. Thermal bonding is generally achieved at very high temperatures, in excess of 400 C. Adhesive bonding can be achieved at lower temperature, but adhesive outgassing is a concern. Therefore wafer bonding is not a suitable and cost-effective method for some applications.

Another approach is to use Liquid crystal polymer (LCP). It has recently become a popular candidate for various packaging approaches, due to its excellent electrical, mechanical and environmental properties. The material comes in rolls and can be laminated unto the wafer as a film. A general method is to use multiple stacks of LCP. Individual holes were created in a layer of LCP and laminated over the wafer so that the device or FETs are exposed through the holes. This first layer of LCP forms the sidewall of the cavity. Then a second layer of LCP is laminated over the entire wafer, thus enclosing the cavity, see Dane. C. Thompson, Manos M. Tentzeris, John Papapolymerou, "Packaging of MMICs in Multilayer of LCP Substrates," IEEE Microwave and Wireless Components Letters, vol. 16, No. 7, July 2006. Single stack of LCP can also be used, but cavities still must be formed on the material before lamination unto wafer, see Dane. C. Thompson, Nickolas Kinglsley, Guoan Wang, John Papapolymerou, Manos M. Tentzeris, "RF Characteristics of Thin Film Liquid Crystal Polymer (LCP) Packages for RF MEMS and MMIC Integration", Microwave Symposium Digest, 2005 IEEE MTT-S International, 12-17 Jun. 2005 Page(s):4 pp. and Mogan Jikang Chen, Anh-Vu H. Pham, Nicole Andrea Evers, Chris Kapusta, Joseph Iannotti, William Komrumpf, John J. Maciel, Nafiz Karabudak, "Design and Development of a Package Using LCP for RF/Microwave MEMS Switches", IEEE Transactions on Microwave Theory and Techniques, vol. 54, No. 11, November 2006. The prior work mentioned above requires very accurate alignment during wafer bonding which limits the flexibility to create small cavities that cover just the active devices and individual passive components. Generally, with a larger cavity, not only is the risk for mechanical failure is greater, environmental protection of the package may also be compromised, see Aaron Dermarderosian, "Behavior of Moisture in Sealed Electronic Enclosures," International IMAPS conference in San Diego, October of 2006. These issues with traditional methods limit the manufacturability and performance of the package.

In multichip-module packaging approaches, the chips are packaged by spinning or laminating the dielectric film over the entire chip. Prior work have been done using various combination of Kapton E, BCB, SPIE, etc., see Vikram B. Krishnamurthy, H. S. Cole, T. Sitnik-Nieters, "Use of BCB in High Frequency MCM Interconnects", IEEE Transactions on Components, Packaging, and Manufacturing Technology— Part B, vol. 19, No. 1, February 1996. A dielectric film deposited directly on top of transistors generally degrades its performance due to the increased parasitic capacitance. The multichip-module packaging is a chip-level rather than a wafer-level approach.

In another wafer-level packaging approach, caps made from different material, such as LCP, glass, etc. were dropped unto the wafer to cover individual chips. The caps were sealed in place using adhesives. Again, this is a complex process that picks and places the caps on individual chips; see George Riley, "Wafer Level Hermetic Cavity Packaging", http://www.flipchips.com/tutorial43.html.

Another method and package is described in U.S. Pat. No. 8,035,219 entitled, "Method for Packing Semiconductors at a Wafer Level", inventor William J. Davis, Ward G. Fillmore, and Scott MacDonald, issued Oct. 11, 2011 assigned to the same assignee as the present invention.

In accordance with the present embodiment, a method is provided for packaging a plurality of semiconductor devices formed in a surface portion of a semiconductor wafer. The method includes: forming device exposing openings and electrical contact exposing opening in a dielectric layer disposed on the surface portion of the semiconductor wafer to expose the devices and electrical contacts pads, respectively; and depositing a porous material in the device exposing openings over the devices.

In one embodiment, a package is provided for a semiconductor device formed in a surface portion of a semiconductor wafer. The package includes: a dielectric layer disposed on the surface portion of the semiconductor wafer having a device exposing opening to expose one of the devices and an electrical contacts pad opening to expose an electrical contact pad; and a porous material in the device exposing opening over said one of the devices.

In one embodiment, the dielectric layer is a lithographically processable material.

In one embodiment, the package includes a second dielectric layer deposed over the first-mentioned dielectric layer and over the porous material.

In embodiment, the second dielectric has openings in registration with the electrical contact exposing opening.

In one embodiment, the second dielectric layer is a lithographically processable material.

In one embodiment, a package is provided for a semiconductor device formed in a surface portion of a semiconductor wafer. The package includes: a first dielectric layer comprising a first lithographically processable material disposed on the surface portion of the semiconductor wafer having a device exposing opening to expose one of the devices and an electrical contacts pad opening to expose an electrical contact pad such one of the devices; a porous material in the device exposing opening over said one of the devices; and a second dielectric layer comprising a second lithographically processable material disposed on the porous material and on selected regions of the first dielectric layer and absent from the electrical contacts pad opening of the first dielectric layer.

In one embodiment, the porous material is an aerogel.

In one embodiment, the porous material is an aerogel-polymer.

In one embodiment, the porous material is greater than 95 percent air by solid.

In one embodiment, the porous material has a porosity in the range of 60-95 percent air.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
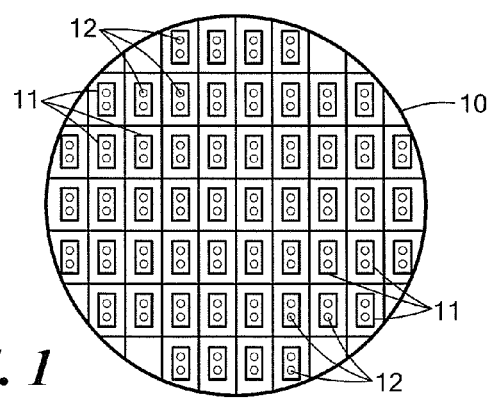
FIGS. 1 through 12 show a semiconductor wafer having devices therein packaged in accordance with the invention at various steps in such packaging.
Figure 2:
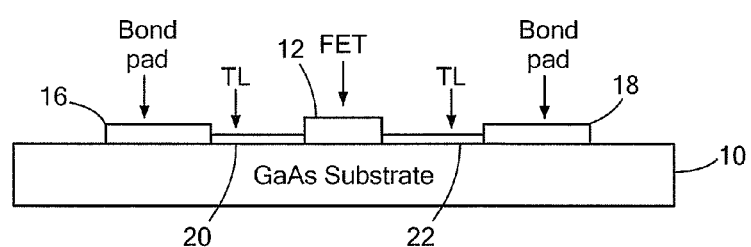

Referring now to FIG. 1, a semiconductor wafer 10, somewhat simplified, is shown having a plurality of semiconductor integrated circuits 11. Devices 12 are formed in a surface portion of each of the integrated circuits 11, here the upper surface portion thereof, is shown. An exemplary one of the devices 12 within one of the integrated circuits 11 is shown in FIG. 2. Thus, here the wafer is for example, a GaAs or SiC wafer 10, and the devices are, for example, field effect transistors (FETs) here shown for example connected to bond pads 16, 18 through transmission lines 20, 22 respectively, as shown.

Figure 3:
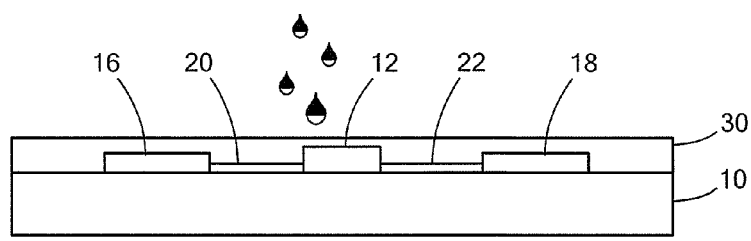

Next, a lithographically processable, etchable material 30 is deposited over the upper surface portion of the semiconductor wafer 10, as shown in FIG. 3. Here, for example, lithographically processable, etchable material 30 can be an organic or inorganic material, that can be easily patterned on a wafer using conventional lithographic and etch process to form the sidewall of a cavity to be described. In one embodiment, Benzocyclobutane (BCB) is used being a dielectric material with excellent electrical properties. It has been used in many applications for dielectric coating, 3D interconnect and packaging, see for example, Kenjiro Nishikawa, Suehiro Sugitani, Koh Inoue, Kenji Kamogawa, Tsuneo Tokumitsu, Ichihiko Toyoda, Masayoshi Tanaka, "A Compact V-Band 3-D MMIC Single-Chip Down-Converter Using Photosensitive BCB Dielectric Film", *IEEE Transactions on Microwave Theory and Techniques*, vol. 47, No. 12, December 1999, and Rainer Pelzer, Viorel Dragoi, Bart Swinnen, Philippe Soussan, Thorsten Matthias, "Wafer-Scale BCB Resist-Processing Technologies for High Density Integration and Electronic Packaging", 2005 International Symposium on Electronics Materials and Packaging, December 11-14.

The BCB material 30 can be dispensed as a liquid, spun on, exposed, developed and cured, all using conventional semiconductor fabrication equipment. Because BCB can be patterned by conventional photolithographic technique, it can achieve alignment tolerances and critical dimensions similar to that of photoresist (limited by film thickness). A spin-on process is preferable to a lamination process (such as that for LCP) from a mechanical and process simplicity standpoint. The spin-on process introduces less stress to the wafer, especially for the mechanical fragile structures such as air bridges and is more capable of self leveling over complex circuit topologies.

Figure 4:
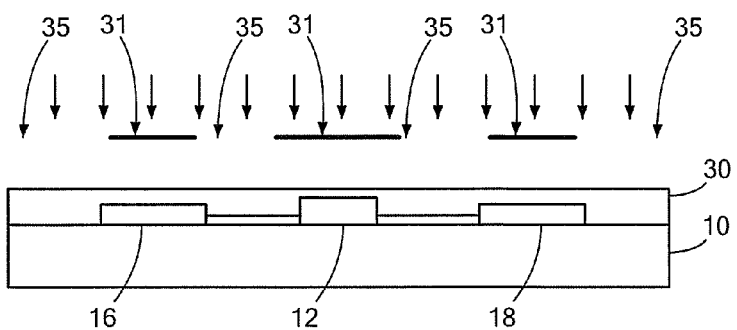
Figure 5:
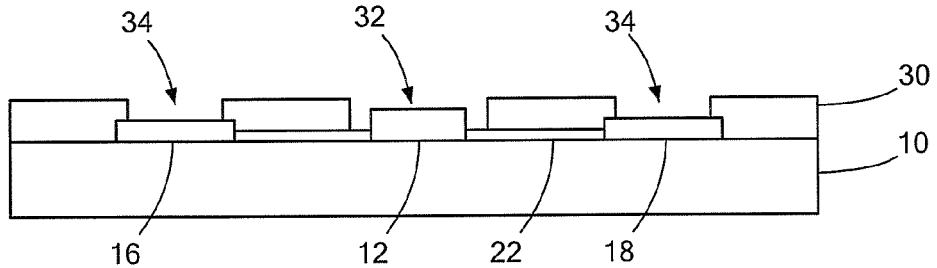

Next, the material 30 is photolithographically processed, as shown in FIG. 4, using a mask 31 having windows 35 disposed over the devices 12 and contact pads 16, 18. After unexposed portions of the BCB material 30 are developed away, device openings 32 are formed therein to expose the devices 12 and electrical contacts pads openings 34 are formed therein to expose electrical contact pads 16, 18 as shown in FIG. 5.

Figure 6:
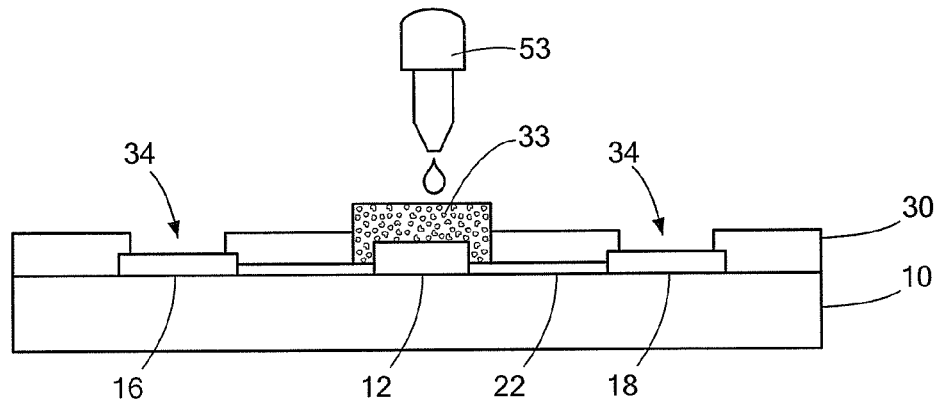

Next, a gelling precursor solution of dielectric material 33 is deposited in the device openings 32 covering the devices 12 and on adjacent portions of the transmission lines 20, 22, as shown in FIG. 6. Here the porous, dielectric material 33 is for example, a gelling precursor solution 33 of the aerogel-polyimide in liquid form which can be subsequently processed to form an aerogel-polyimide having greater than 95 percent air by solid, preferable having a range between 60 to 95 percent air.

Figure 7:
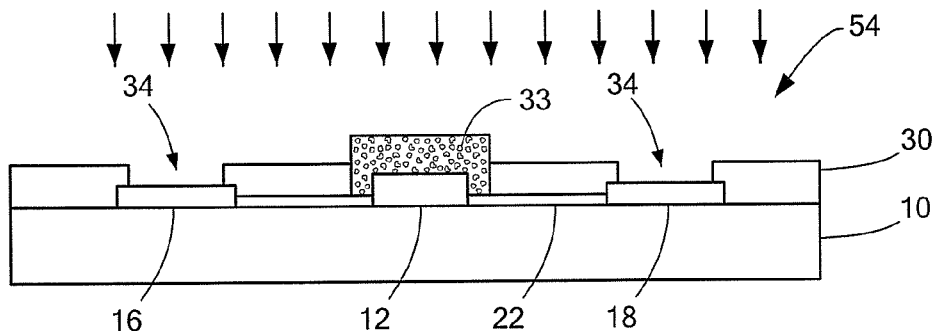

The process includes depositing a gelling precursor solution 33 of the aerogel-polyimide in liquid form, on a portion of the circuit including the FET 12. The gelling precursor solution 33 may be deposited by any suitable process such as, for example, spin coating, stencil printing or dot dispensing. In one embodiment, the gelling precursor solution 33 is deposited by a dot dispensing 53 in FIG. 6. The gelling precursor solution is then processed on the portion of the circuit including the FET to form an aerogel dielectric layer 33 on the FET 12. The processing may include drying by any suitable process, for example, supercritical $CO_2$ drying at 55° C. and 1600 psi 54 in FIG. 7 to thereby solidify the deposited precuror into the final aerogel-polyimide dielectric 33 to provide the porous dielectric described above. Here, for example, the aerogel has a low dielectric constant. The aerogel dielectric layer may have a loss tangent of approximately 0.002 to 0.007. A low loss tangent is desirable because it reduces the rate at which electromagnetic energy is dissipated.

Figure 8:
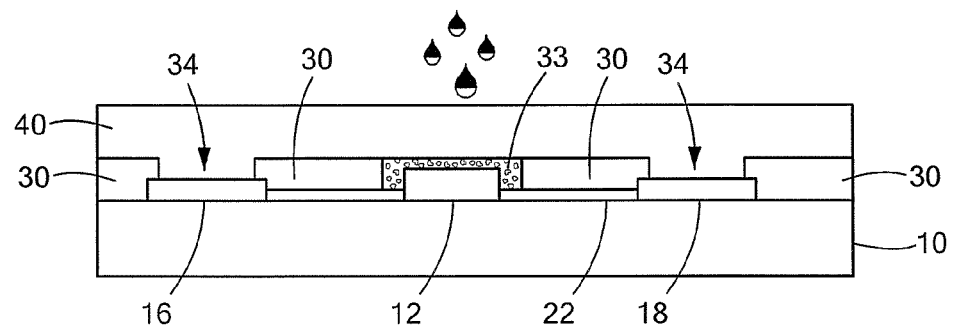

After openings or cavities 32, 34 in the BCB material 30 are filled with the porous dielectric material 33, the openings or cavities 32, 34 are enclosed using a spin coated, low dielectric layer 40. Layer 40 is mechanically stronger than the porous dielectric material 33 and has good adhesion to BCB material 30. More particularly, a dielectric layer 40 of a second lithographically processable material 40 is provided over the formed first lithographically processable material, such material 40 being coated over the device filled openings 32, 24 (i.e., cavities) in the material 30, FIG. 8.

Here, the first lithographically processable material 30 and the second lithographically processable material 40 comprise the same type of material. In this embodiment, the first lithographically processable material 30 and the second lithographically processable material 40 comprise BCB, here for example having thicknesses of about 17 micrometers.

Figure 9:
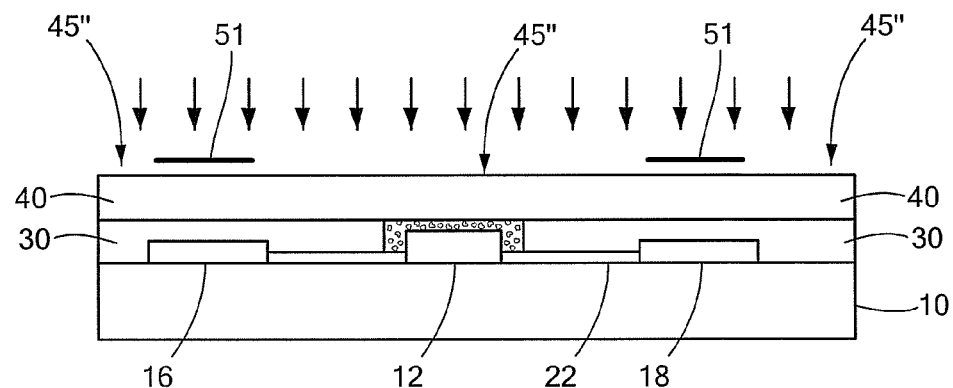
Figure 10:
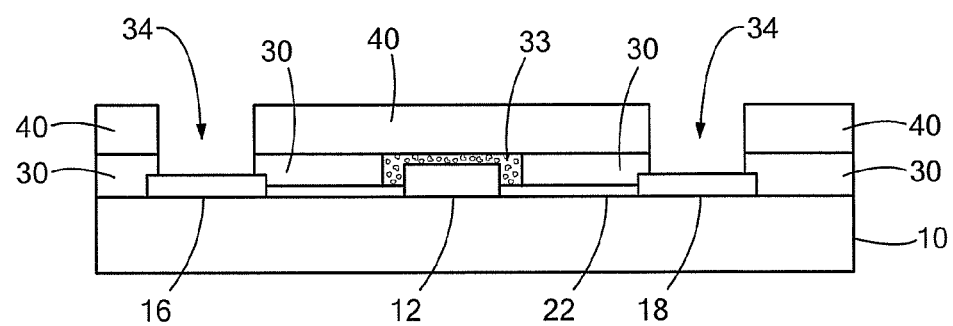

Next, referring to FIG. 9, the second lithographically processable material i.e., layer 40, is photolithographically processed by exposing selected unmasked region 45' of the second lithographically processable material 40 to UV radiation as indicated passing through openings 45 in a photo mask 51, as shown. Thus, after immersing the structure in a developer solution as shown in FIG. 10, the unexposed portions 40" of the second photolithographically processable material 40 are removed forming areas for interconnection to bond pads 16 and 18.

Figure 11:
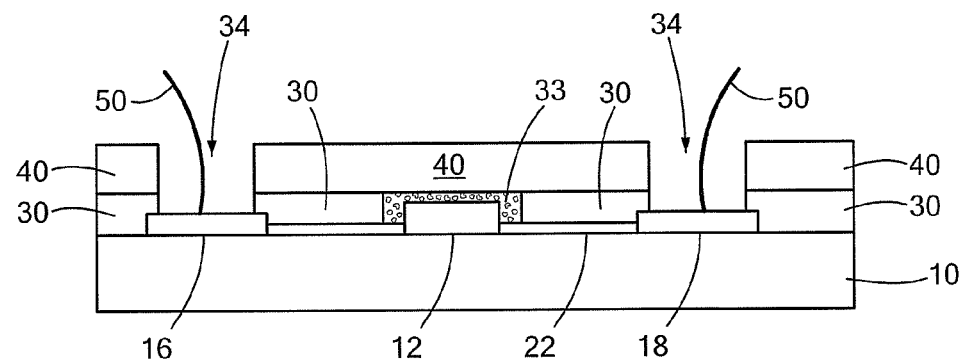
Figure 12:
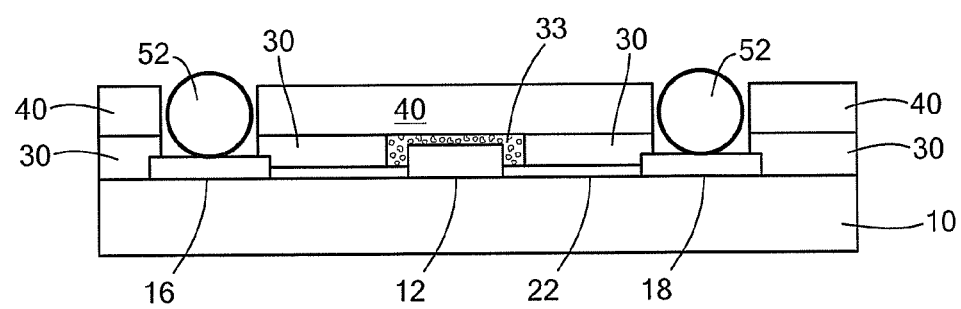

Next, the protected device 12 is ready for wire bonds 50 and final assembly, as shown in FIG. 11. Or, the structure shown in FIG. 11 is provided with solder balls 52 as indicated in FIG. 12 for flipped assembly.

A number of embodiments of the invention have been described. For example, materials other than BCB may be used such as SU_8. Further, while the porous material is shown disposed over a transistor, it may be disposed over other devices such as capacitors, resistors, for example. Still further, it should be understood that positive or negative tone photolithographically processable materials may be used. Still further, the contact pad and device exposing openings may be formed using lasers without the use of photolithographically processable materials. It should therefore be understood that various modifications may be made without departing from the spirit and scope of the invention. Accordingly, other embodiments are within the scope of the following claims.

What is claimed is:

1. A method for packaging a plurality of semiconductor devices formed in a surface portion of a semiconductor wafer, comprising:
    forming device exposing openings and electrical contact pads exposing opening in a dielectric layer disposed on the surface portion of the semiconductor wafer to expose the electrical devices and electrical contacts pads, respectively; and
    depositing a porous material selectively in the device exposing openings over the electrical devices while leaving exposed the electrical contact pads.

2. The method recited in claim 1 wherein the dielectric layer is a lithographically processable material.

3. The method recited in claim 1 wherein including forming a second dielectric layer deposed over the first-mentioned dielectric layer and over the porous material.

4. The method recited in claim 3 including forming openings in the second dielectrics layer in registration with the electrical contact exposing opening.

5. The method recited in claim 4 wherein the second dielectric layer is a lithographically processable material.

6. A package for a semiconductor device formed in a surface portion of a semiconductor wafer, the package comprising:
    a dielectric layer disposed on the surface portion of the semiconductor wafer having a device exposing opening to expose one of the devices and an electrical contacts pad opening to expose an electrical contact pad; and
    a porous material in the device exposing opening over said one of the devices, the porous material being absent from the exposed electrical contact pad.

7. The package recited in claim 6 wherein the dielectric layer is a lithographically processable material.

8. The package recited in claim 6 including a second dielectric layer deposed over the first-mentioned dielectric layer and over the porous material.

9. The package recited in claim 8 wherein the second dielectric has openings in registration with the electrical contact exposing opening.

10. The package recited in claim 9 wherein the first-mentioned dielectric layer and the second dielectric layer are lithographically processable materials.

11. The method recited in claim 1 wherein the porous material is an aerogel polymer.

12. The method recited in claim 1 wherein the porous material is an aerogel-polymer.

13. The method recited in claim 1 wherein the porous material is greater than 95 percent air by solid.

14. The method recited in claim 1 wherein the porous material has a porosity in the range of 60-95 percent air.

15. The package recited in claim 2 wherein the porous material is an aerogel polymer.

16. The package recited in claim 2 wherein the porous material is an aerogel-polymer.

17. The package recited in claim 2 wherein the porous material is greater than 95 percent air by solid.

18. The package recited in claim 2 wherein the porous material has porosity in the range of 60-95 percent air.

19. A package for a semiconductor device formed in a surface portion of a semiconductor wafer, comprising:
    a first dielectric layer comprising a first lithographically processable material disposed on the surface portion of the semiconductor wafer having a device exposing opening to expose one of the devices and an electrical contacts pad opening to expose an electrical contact pad such one of the devices;
    a porous material in the device exposing opening over said one of the devices and absent from the entire electrical contact pad; and
    a second dielectric layer comprising a second lithographically processable material disposed on the porous material and on selected regions of the first dielectric layer and absent from the electrical contacts pad opening of the first dielectric layer.

20. The package recited in claim 10 wherein the porous material is an aerogel polymer.

* * * * *